(12) United States Patent
Papallo, Jr. et al.

(10) Patent No.: US 6,771,170 B2
(45) Date of Patent: Aug. 3, 2004

(54) POWER SYSTEM WAVEFORM CAPTURE

(75) Inventors: Thomas Frederick Papallo, Jr., Farmington, CT (US); Mark Fredrick Culler, Glastonbury, CT (US); David Fletcher, Simsbury, CT (US); Gregory Lavoie, Bristol, CT (US); John James Dougherty, Collegeville, PA (US); Michael S. Tignor, Watertown, CT (US)

(73) Assignee: General Electric Company, Schenectady, NY (US)

( * ) Notice: Subject to any disclaimer, the term of this patent is extended or adjusted under 35 U.S.C. 154(b) by 540 days.

(21) Appl. No.: 09/681,456

(22) Filed: Apr. 10, 2001

(65) Prior Publication Data

US 2002/0145517 A1 Oct. 10, 2002

(51) Int. Cl.[7] ................................................. G08B 1/00
(52) U.S. Cl. ....................... 340/531; 340/506; 340/507; 340/508; 340/511; 340/310.01; 340/310.06; 702/66; 702/67; 702/64
(58) Field of Search ................................. 340/531, 506, 340/507, 508, 511, 538, 286.02, 310.01, 310.06; 702/57, 66, 67, 64; 324/500, 76.11, 76.15

(56) References Cited

U.S. PATENT DOCUMENTS

| | | | |
|---|---|---|---|
| 5,224,054 A | 6/1993 | Wallis ........................ 364/483 |
| 5,600,527 A | 2/1997 | Engel et al. ................... 361/93 |
| 5,706,204 A | 1/1998 | Cox et al. .................... 364/487 |
| 5,768,148 A | 6/1998 | Murphy et al. ............. 364/492 |
| 5,871,512 A | * | 2/1999 | Hemming et al. ............ 607/28 |
| 5,890,097 A | 3/1999 | Cox ............................ 702/67 |
| 6,415,244 B1 | * | 7/2002 | Dickens et al. ............. 702/187 |
| 6,675,071 B1 | * | 1/2004 | Griffin, Jr. et al. .......... 700/286 |

* cited by examiner

Primary Examiner—Daryl Pope
(74) Attorney, Agent, or Firm—Cantor Colburn LLP

(57) ABSTRACT

A circuit monitoring system for performing synchronized waveform capture. A waveform capture trigger communication network interconnects a plurality of monitoring devices. The system provides direct device to device trigger communication between monitoring devices in a synchronized group. Power system waveform data is stored in the monitoring device memory of all members of the synchronized group in response to a trigger event initiated by any monitoring device in the synchronized group. High speed trigger communication results in substantially simultaneous waveform capture among the members of the synchronized group.

32 Claims, 6 Drawing Sheets

POWER SYSTEM WAVEFORM CAPTURE

FIELD OF INVENTION

The invention relates generally to measuring, monitoring, analyzing, recording and communicating electrical power system parameters. The invention further relates to the use of a trigger signal from a monitoring device to initiate power system waveform capture at a plurality of points in the power system. The invention also relates to the simultaneous storage of the power system waveform data.

BACKGROUND OF INVENTION

Power system parameters are measured, analyzed and recorded for the purpose of system evaluation and planning. Waveform analysis, including harmonic analysis, is often performed on power system waveforms to determine the root cause of power system anomalies. Measured data is also used to calculate real power, reactive power, energy consumption and the like.

Generally, power system parameters are measured at various points throughout the power system by individual power system monitoring devices. Often the monitoring devices are interconnected via a communication network and integrated into a power management system. The power management system control unit coordinates network communication. Additionally, the control unit allows the user to retrieve data from each of the monitoring devices. However, the communication speed of power management systems is relatively slow because there is no direct monitoring device to monitoring device trigger communication and the control unit must periodically poll each device for data.

State of the art monitoring devices include an internal trigger that initiates a waveform capture when one or more power system parameter deviates outside predetermined values. Power system analysis is most effective when the user can evaluate data simultaneously recorded at multiple points in the power system. However, state of the art monitoring devices cannot provide this data because they do not generate shared trigger signals.

In one approach, manufacturers rely on power management control units to provide a common external trigger signal to initiate simultaneous waveform capture in multiple monitoring devices. However, this approach is deficient because the signal is sent over the communication network hence its speed is limited by the speed of the system and the amount of data being communicated.

The system response time is delayed further when a monitoring device identifies a trigger event but a control unit issues the common trigger signal. Where waveform capture is event triggered the waveform capture doesn't occur until the monitoring device communicates data to the control unit, the data is processed by the control unit and a trigger signal is communicated back to the monitoring devices. The added communication and processing performed by the control unit delays the waveform capture. Additionally, multiple monitoring device waveform capture will not be initiated when there is a problem with control unit operation.

In a second approach, each capturing device internally triggers a waveform capture where a common electrical condition is sensed by multiple devices. This approach is deficient because all devices may not be triggered by the fault due to sensitivity of settings and differences in electrical appearance of the fault at different locations. Today, the time synchronization precision of many communication protocols is inadequate to assure that captured events stored in multiple devices are properly associated with an electrical condition common to all.

SUMMARY OF INVENTION

It is therefore advantageous to design a circuit monitoring system having direct montoring device to monitoring device trigger communication. It is also seen to be desirable to provide substantially simultaneous waveform capture independent of a control unit thereby increasing waveform capture reliability, speed and synchronization among multiple monitoring devices. Further advantages are provided when the preceding features can be retrofitted to existing systems and devices.

Accordingly, the present invention provides a plurality of monitoring devices capable of performing a waveform capture following generation of an internal trigger signal or upon receipt of an external trigger signal communicated directly from another monitoring device in the network. Monitoring devices are also capable of generating an external trigger signal and communicating the signal directly to other monitoring devices to initiate a simultaneous waveform capture.

Additional advantages and novel features of the invention will be set forth in part in the description which follows, and in part will become apparent to those skilled in the art upon examination of the following or may be learned by practice of the invention. The objects and advantages of the invention may be realized and attained by means of instrumentalities and combinations particularly pointed out in the appended claims.

DETAILED DESCRIPTION

Figure 1:
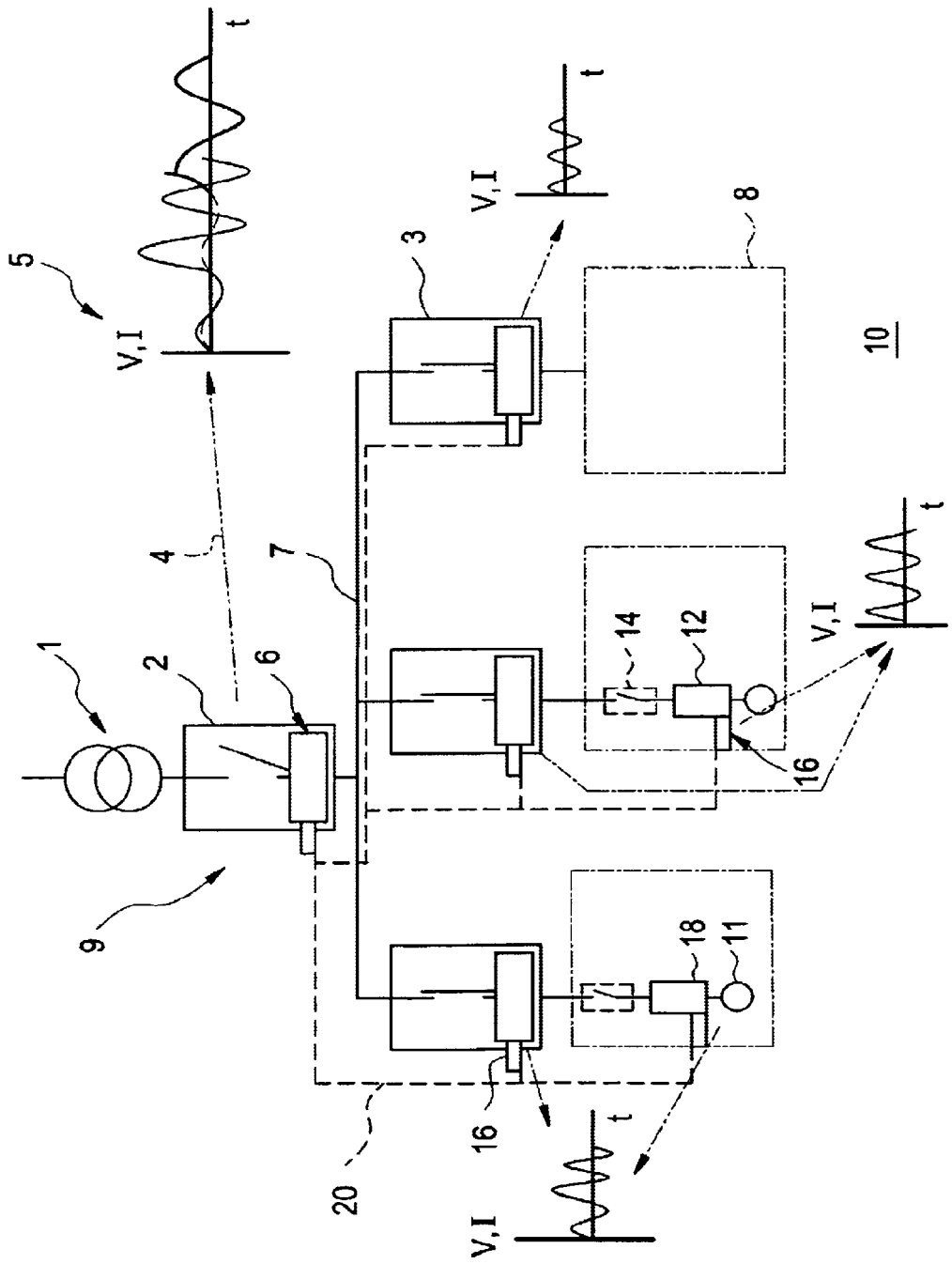
FIG. 1 is a block diagram of an electrical distribution system in accordance with a preferred embodiment of the present invention.

Referring to FIG. 1, a first embodiment of a circuit monitoring system 10 employed in an electrical power system is shown. FIG. 1 includes a power system source 1, a main circuit interrupter 2, branch circuit interrupters 3, a primary electrical circuit 7, and load 8. Electrical power is supplied to the load 8 through the primary electrical circuit 7 by the main circuit interrupter 2 and a branch circuit interrupter 3. In FIG. 1, the electrical equipment 9 described by circuit interrupters 2 and 3 represents an industrial distribution center such as a switchboard, loadcenter and the like. However, it will be recognized that the invention can be employed at any point in an electrical power system where monitoring devices are installed. Monitoring devices 6 are typically installed in electrical distribution, transmission and generation equipment including motor control centers, unit substations, residential loadcenters, low, medium and high voltage switchgear and the like.

FIG. 1 provides two examples of the load 8 as a motor 11. The motor 11 is generally supplied through additional control equipment, for example, a motor starter 18 or variable speed drive 12. It will also be recognized that the invention is not limited to any particular power circuit configuration. For example, the load 8 can include rotating equipment, lighting equipment, control equipment and the like.

Figure 2:
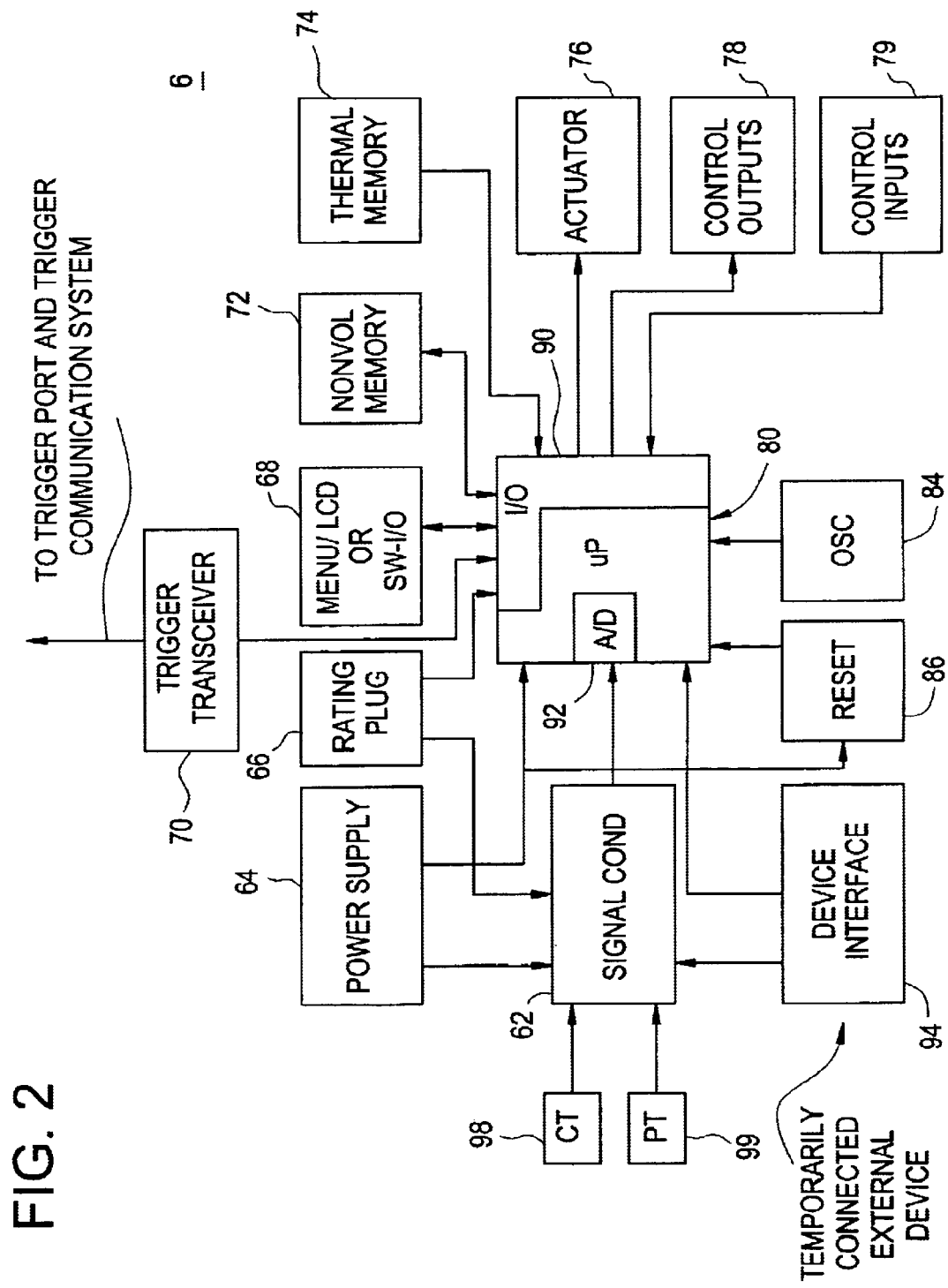
FIG. 2 is a block diagram of an electronic trip unit in accordance with FIG. 1.
Figure 5:
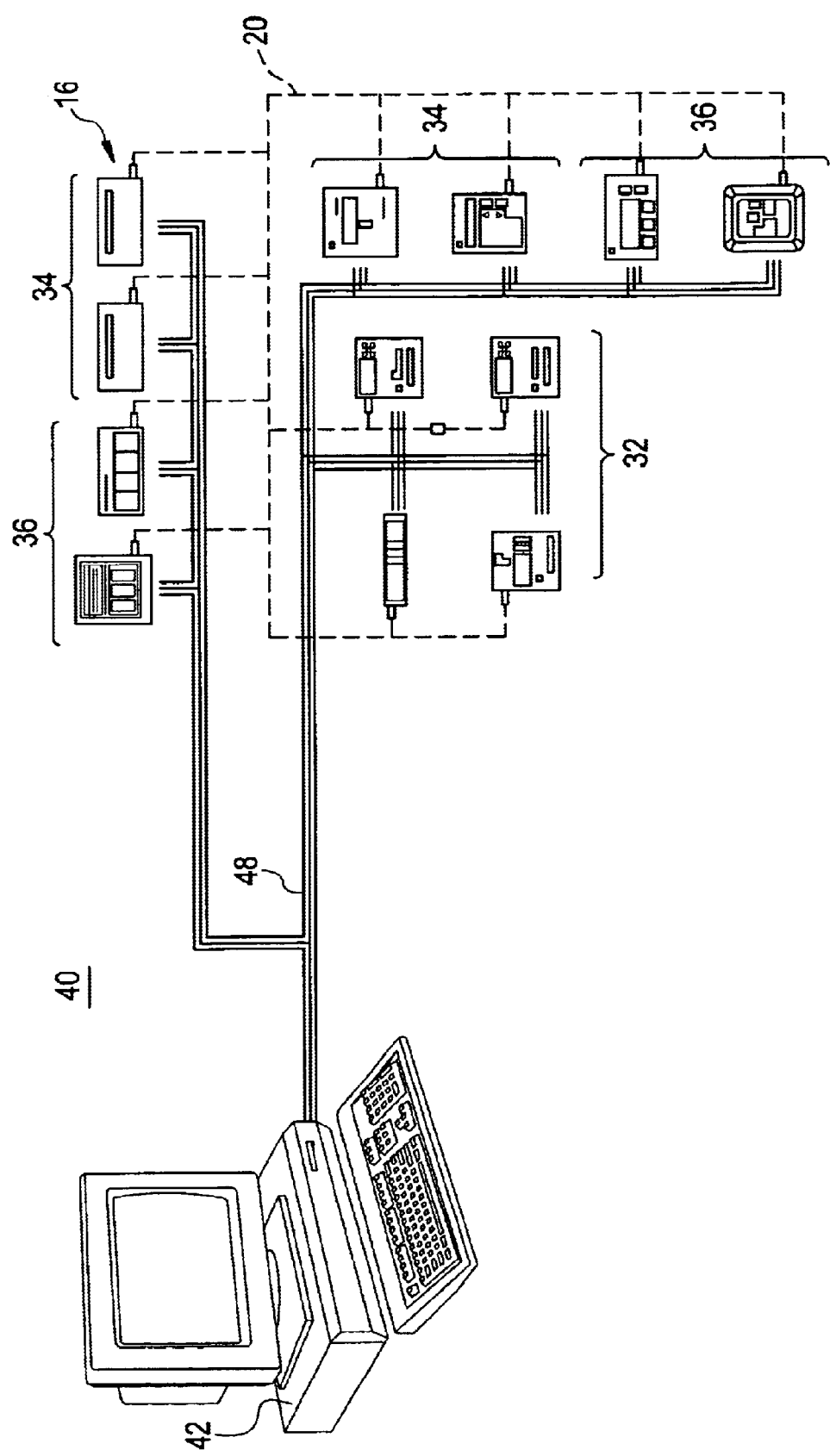
FIG. 5 is a block diagram of a power management control system in accordance with FIG. 3.

A monitoring device 6 is a device capable of performing a power system waveform capture. For example, meters, relays, electronic trip units and the like. Waveform capture is the capture of sample points of one or more phases of current or voltage. FIG. 5 demonstrates monitoring devices including meters 34, relays 36, and electronic trip units 32. Monitoring devices 6 are often an integral component of a circuit interrupter 2, 3. Additionally, monitoring devices 6 may be an integral part of control equipment such as the motor starter 18 and variable speed drive 12 of FIG. 1 and the like. The monitoring devices 6 receive inputs in the form of power system waveform data, typically voltage and current. FIG. 2 represents the architecture of a monitoring device 6 in the form an electronic trip unit. The power system waveform data is sensed by direct connection of monitoring device inputs to the primary electrical circuit 7 in low power applications. External current sensors 98, and voltage sensors 99 are used to supply monitoring device inputs in high power applications. The output of sensors 98, 99 are directly connected to the monitoring device 6 inputs.

The monitoring device 6, in FIG. 2, includes a microprocessor 80 programmed to share data with other components via an integral input-output system 90. LCD panels 68 are not required of a monitoring device 6 but are often provided. The LCD panel 68 provides a local display and serves as a local user interface. The user can control the operation of the circuit interrupter 2, 3 and monitoring device 6 through the LCD panel 68 and a related keypad (not shown). The local keypad and LCD panel 68 may also be used to enter and review waveform capture settings.

A trigger event occurs when the power system waveform data demonstrates a characteristic for which the user desires to capture sample points of the power system waveform. The user programs the monitoring devices 6 with a trigger event threshold for specific trigger events that are of interest. For example, a phase current greater than a predetermined trigger event threshold could be a characteristic that triggers a waveform capture. Each monitoring device can be programmed for multiple trigger events generated by a variety of waveform characteristics including voltage and current magnitudes, phase imbalances and rates of change. An internal trigger signal is produced as a result of a trigger event. A corresponding external trigger signal is produced every time an internal trigger signal is generated. In a preferred embodiment shown in FIG. 1 and FIG. 2 a trigger transceiver 70 is connected to a trigger port 16. The trigger transceiver 70 is a bi-directional device that both transmits internal trigger signals to remote monitoring devices 6 and receives trigger signals from remote monitoring devices 6. A trigger communication network 20 interconnects the trigger port 16 of each monitoring device 6 and facilitates trigger signal transmission. In a preferred embodiment the trigger communication network 20 operates at a high rate of speed in order to provide substantially simultaneous waveform capture among a group of monitoring devices 6.

A synchronized group of monitoring devices 6 is comprised of all monitoring devices 6 that are programmed and interconnected to perform substantially simultaneous waveform capture. In FIG. 1, the trigger communication network is a shielded twisted pair of conductors. Alternatively, the trigger communication network could comprise a fiber optic cable, a coaxial cable and the like. In a further alternate embodiment the trigger communication is a wireless system. The interconnection of the circuit interrupters 2, 3, the variable speed drive 18 and the motor starter 12 by the trigger communication network 20 creates a synchronized group of monitoring devices 6. A signal voltage is normally present on the trigger communication network 20. The trigger transceiver 70 in each monitoring device 6 of a synchronized group of monitoring devices monitors the presence of the signal voltage. The value of the signal voltage changes when any member of the synchronized group initiates a trigger signal. The monitoring device 6 that initiates the trigger signal is referred to as the initiating device for the capture of that particular trigger event. The trigger transceivers 70 of the non-initiating monitoring devices 6 within the synchronized group respond to the change in signal voltage by performing a waveform capture. Thus, simultaneous waveform capture among a synchronized group occurs for every trigger event sensed by a member of the synchronized group.

In a preferred embodiment the normal signal voltage is five volts DC. The signal voltage is reduced to approximately zero volts when a monitoring device 6 initiates a trigger signal. The non-initiating monitoring devices 6 perform a waveform capture when they sense the signal voltage reduction.

A waveform capture trigger signal results in the memory 72 storing the requested power system waveform data. The analog power system waveform data is conditioned for use in the monitoring device 6 by signal conditioner 62 and converted to digital data by an A/D converter 92. The waveform is recorded in a continuous circular configuration in digital memory 72. Thus, power system waveform data is recorded for a rolling period because new data is continuously recorded over the oldest existing data in memory 72. In a preferred embodiment the memory 72 is non-volatile memory. Additionally, in a preferred embodiment the memory includes static memory and dynamic memory. The dynamic memory contains the most recent waveform and is continuously overwritten with new more current data. The static memory stores the waveform data when a waveform capture is performed. Each monitoring device 6 performs a waveform capture when instructed by an internal trigger signal or when it receives an external trigger signal generated by any member of the synchronized group.

Referring to FIG. 2, the microprocessor 80 controls sampling of the various current and voltage waveforms by the A/D converter 92 by generating interrupts that establish the sample frequency. Additionally, an adjustable delay may be used to change the time frame of the data captured. For example, the delay is set to zero only if pre-trigger waveform data is to be stored. Only the waveform data in memory when the trigger signal is generated is captured with a zero delay. This pre-trigger data may provide a significant benefit for root cause analysis of the power system anomaly. However, the number of post trigger waveform cycles captured in the memory 72 increases as the delay is increased. The amount of pre-trigger data captured decreases in proportion to the amount of post trigger data that is captured. Waveform graphs 5 provide a symbolic representation of the type of data that monitoring devices 6 capture.

The power system frequency and the interrupting device minimum operating speed are two factors considered when determining the desired communication speed. It is advantageous to provide a communication speed fast enough to insure that the waveform capture data includes waveform data occurring prior to the circuit interruption. It is also advantageous, but not necessary, that the system communication speed to be less than the duration of a complete cycle of the waveform. For example, U.S. power systems usually operate at 60 cycles/second. Therefore, the communication speed should be less than one cycle or 0.01667 seconds. However, substantially simultaneous waveform capture results so long as the communication speed is fast enough to effectively give all the captured waveforms a common time reference for a given trigger event. A communication speed of between 0.02 mS 4 mS will provide the desired result, "mS" refers to units of milliseconds. One preferred embodiment includes a communication speed of 2 mS or less. Thus, in one preferred embodiment, substantially simultaneous waveform capture equates to capture performed by non-initiating monitoring devices 6 in a synchronized group within 2 mS of the others in the group including the initiating monitoring device 6 in response to a single trigger event. Substantially simultaneous waveform capture may also include waveform capture by monitoring devices in a synchronized group 4 mS or further apart where the characteristics of the triggering power system anomaly can be effectively analyzed with broader synchronization.

High-speed trigger communication provides benefits in addition to simultaneous waveform capture. First, it minimizes the memory requirements of the monitoring device 6. Second, it provides a known capture time for all devices 6 in a synchronized group without the need for a common reference supplied by a control unit 42, FIG. 5.

Large capacity memory is capable of capturing waveform data prior to trigger signal initiation and circuit interruption even where the trigger signal is communicated more slowly because the pre-trigger data is not overwritten as frequently as with smaller memories. The greater the memory storage capacity, the more slowly the trigger signal can be communicated. However, effective waveform capture involves a high sampling frequency and a corresponding high volume of data storage. The invention reduces the memory requirements yet insures the capture of a substantial amount of both the pre-trigger and post trigger waveform if desired.

The high-speed communication insures that each device in a synchronized group responds to the trigger signal at substantially the same time. Thus, event time and date recording, referred to can be limited to a single device in the synchronized group when event timing is required. The other monitoring devices 6 in the synchronized group will necessarily record waveform data at substantially the same time. For example, event timing might be limited to the initiating device.

The invention also eliminates reliance on a control unit 42 for the initiation, communication and event timing of waveform capture events. This reduces system cost and complexity while increasing communication speed. The reduced complexity results in a corresponding increase in reliability.

In FIG. 1, monitoring devices 6 are located at various points in the power system. The synchronized group consists of the circuit interrupters 2, 3, motor starter 12 and variable speed drive 18. A trigger communication network 20 interconnects the monitoring devices for each of the synchronized group. Thus, the monitoring devices 6 in the synchronized group will capture waveform data when any member of the synchronized group initiates a trigger signal.

If, for example, a short circuit occurs within motor 11 the current and voltage waveforms at the motor starter 12 will deviate from normal. A trigger event is created so long as the waveform change satisfies one of the user specified event conditions for one of the monitoring devices 6. In this example, the monitoring device 6 located in motor starter 12 acts as the initiating device because its proximity to the cause of the power system disturbance allows it to most quickly identify the user specified event condition created by the short circuit. The monitoring device 6 of motor starter 12 then initiates an internal and an external trigger signal in response to the trigger event. The initiating monitoring device 6 labels the captured waveform with the event timing. The trigger transceiver 70 of the initiating device generates an external trigger signal that adjusts the signal voltage on the trigger communication network. The non-initiating monitoring devices 6 in the synchronous group receive the external trigger signal through trigger ports 16. The trigger transceivers 70 of non-initiating monitoring devices 6 respond to the trigger signal by prompting waveform data storage in internal memory 72 of monitoring devices 6 at substantially the same time as the other monitoring devices 6, including the initiating monitoring device 6.

A user may retrieve the captured waveform from the monitoring device 6 by entering a request and viewing data at the integral display 68. Alternatively, the stored data can be electronically transferred to a portable monitoring device interface 94, FIG. 2, temporarily connected to the monitoring device 6. In an alternate embodiment communication between the monitoring device 6 and the portable monitoring device interface 94 is wireless. Thus, allowing wireless data transfer between the monitoring device 6 and the portable monitoring device interface 94.

The captured waveform can either be retained in the static portion of memory 72 until the monitoring device 6 is reset or be automatically overwritten when the monitoring device 6 performs the next waveform capture. Where a reset is used the data in the static memory cannot be overwritten until the device is reset. It will be understood that the memory may be reset by a number of methods including manually resetting via a keypad integral with the monitoring device 6, automatic resetting following a data transfer to a monitoring device interface 94, automatic resetting following a change of monitoring device 6 status and the like.

Figure 3:
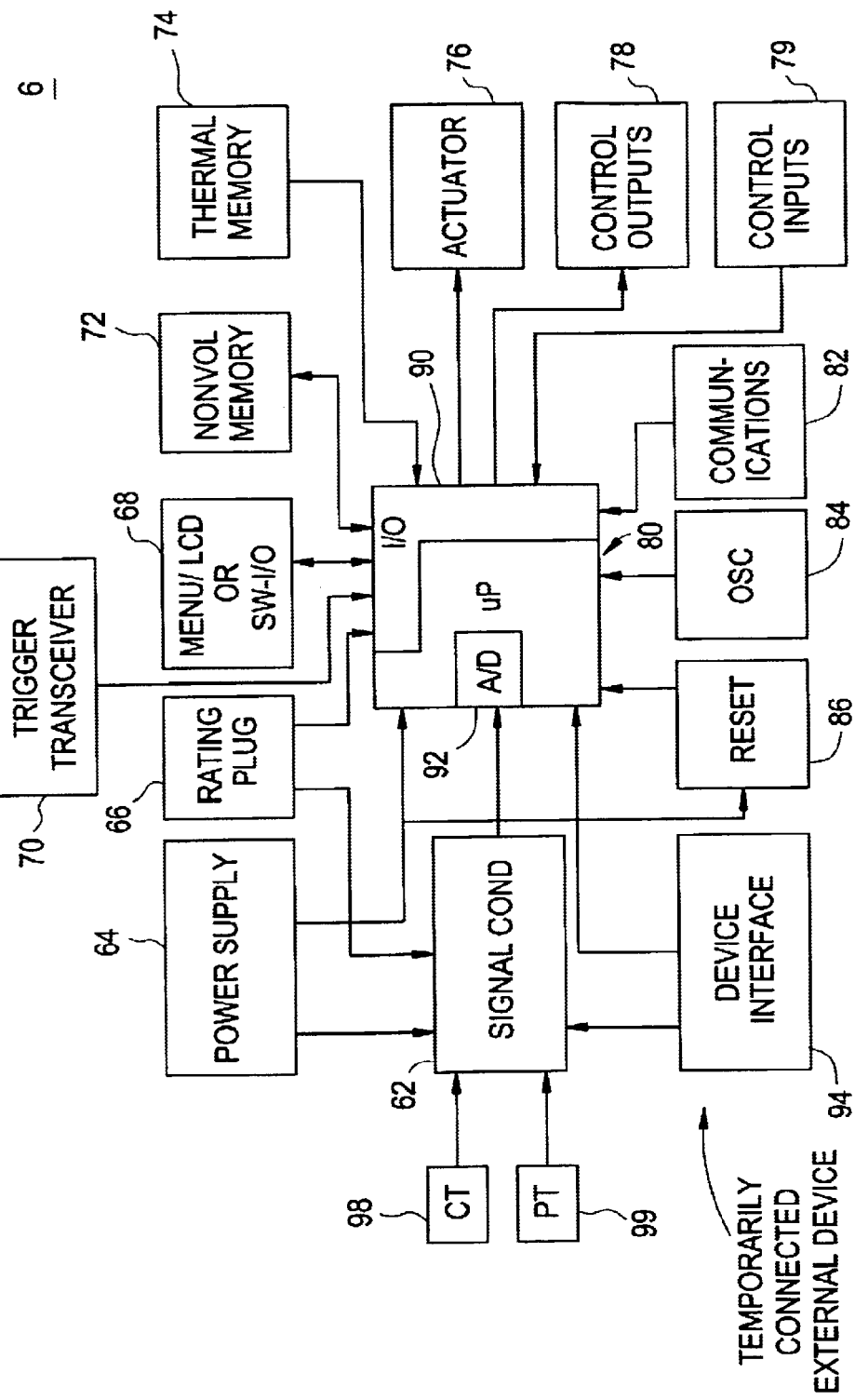
FIG. 3 is a block diagram of an electronic trip unit in accordance with an alternate embodiment of the present invention.

The monitoring device 6 of FIG. 3 is an alternate embodiment including the previously described trigger transceiver 70 in a monitoring device 6 that also includes a separate power management communications link 82. Referring to FIG. 5, power management systems generally include a control unit 42 and multiple monitoring devices 6 such as electronic trip units 32, meters 34 and relays 36. The control unit 42 monitors and controls data from all the monitoring devices 6 in the network. The data generally includes waveform capture data from the remote monitoring devices 6. Additionally, the control unit 42 provides an operator interface from which a user can observe the status of the entire power system. The control unit 42 is embodied in a personal computer in a preferred embodiment.

Referring to FIG. 3, the communication link 82 connects the monitoring device 6 to a power management system 40 shown in FIG. 5. In FIG. 5, a power management communication network 48 connects all devices in the power management system 40 to the control unit 42. The trigger communication network 20 interconnects monitoring devices 6. Thus, the monitoring device 6 of FIG. 3 supplements the advantage of direct device to device high speed trigger communication and substantially simultaneous waveform capture with power management features by keeping the trigger communication and the power management system separate.

The information that is available locally is also communicated from the monitoring device 6 to remote control unit 42 via communication link 82. Therefore, a remote user can view information for a specific monitoring device 6 and control the functions of the monitoring device microprocessor 80. These functions include setting the thresholds at which the monitoring device 6 will issue a waveform capture trigger signal.

The synchronized groups of the alternate embodiment are comprised of monitoring devices 6 as described for the preferred embodiment. The embodiment of FIG. 3 allows a user to set the trigger event thresholds locally via the integral monitoring device keypad and display 68. However, the trigger event thresholds may also be set via the power management system 40 from a control unit 42. A trigger event sensed by an initiating device within a synchronized group will issue from trigger transceiver 70. The initiating device will perform a waveform capture. The non-initiating devices within the synchronized group will sense the trigger signal via trigger transceivers 70, perform a waveform capture and store the waveform in memory 72 as described for the preferred embodiment.

The power management communication network 48 expands the data retrieval and storage capabilities. For example, following a waveform capture the waveform stored in memory 72 of each monitoring device 6 can be retrieved and stored by the control unit 42. Data retrieval can be performed a number of ways with the embodiment of FIG. 3 such as when requested by the user, automatically on a periodic basis, automatically anytime a trigger event occurs and the like. Similarly, the reset function can be performed manually or automatically by the control unit 42 following data retrieval.

The invention eliminates reliance on a control unit 42 for the initiation, communication and event timing of waveform capture events. The initiating device labels the captured waveform with the event timing.

Figure 4:
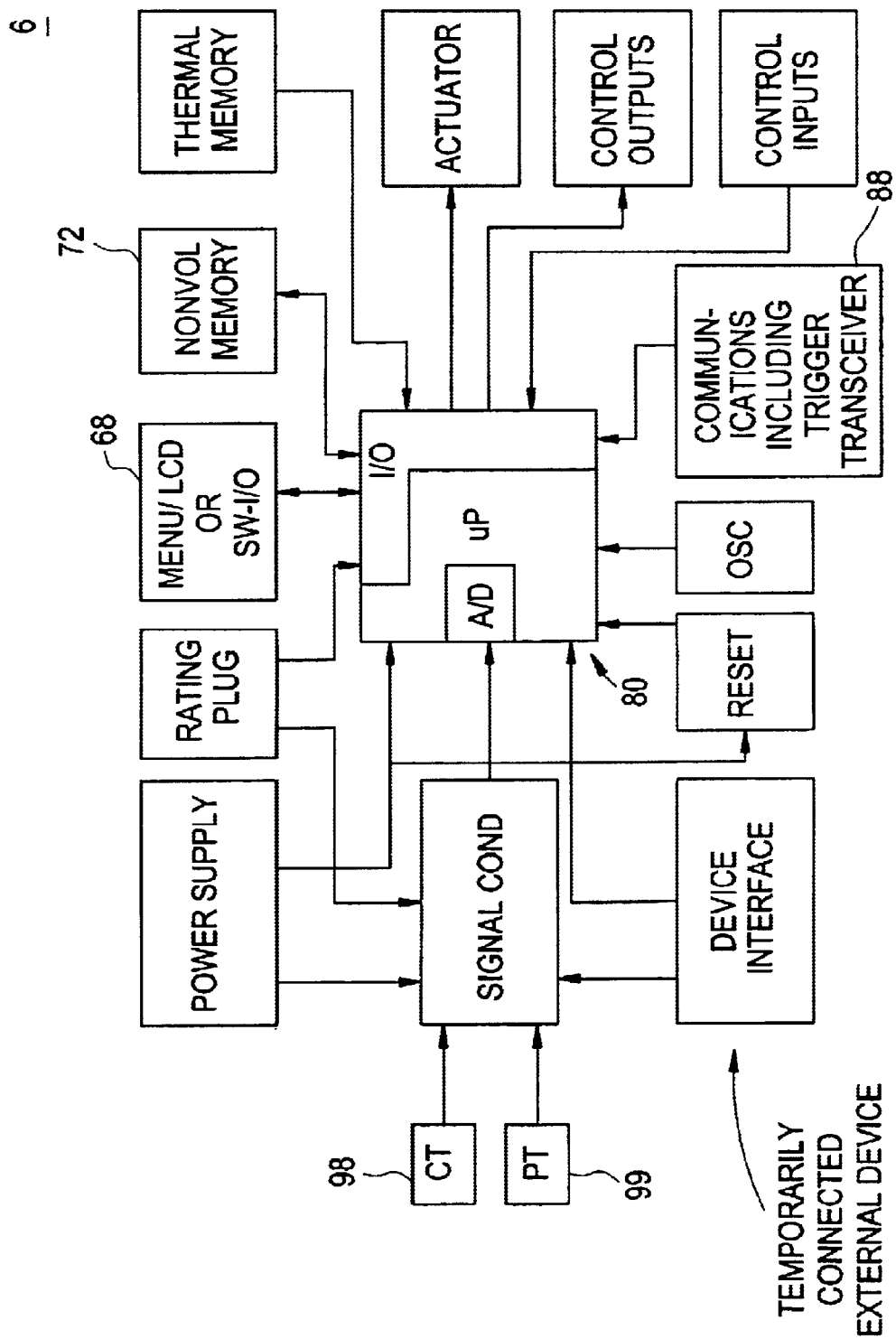
FIG. 4 is a block diagram of an electronic trip unit in accordance with a second alternate embodiment of the present invention.
Figure 6:
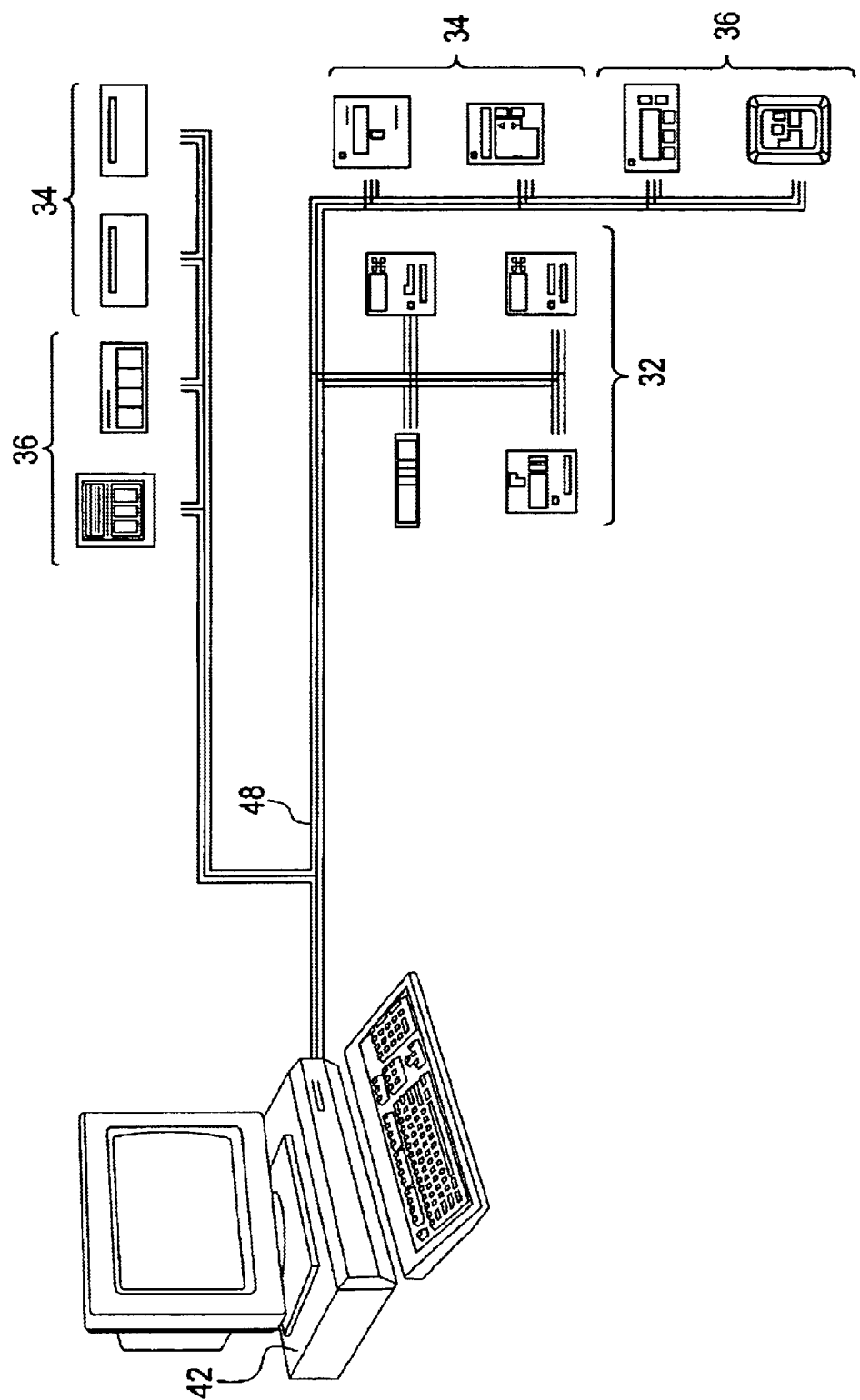
FIG. 6 is a block diagram of a power management control system in accordance with FIG. 4.

The monitoring device 6 of FIG. 4 is configured in a second alternate embodiment of FIG. 2 with the integration of the trigger communication and the power management communication link 88. Referring to FIG. 4 and FIG. 6, the power management communication link 88 connects the monitoring device 6 embodied in an electronic trip unit 32 to a power management system 40. In FIG. 6 a power management communication network 48 connects all devices in the power management system 40 to the control unit 42.

Significantly, the second alternate embodiment incorporates trigger communication in the existing power management communication network 48. Thus, the trigger signal is sent to remote devices via communication link 88, and external trigger signals are received via the same communication link 88.

The invention embodied in FIG. 4 and FIG. 6 reduces the communication time of typical waveform capture instructions issued by a power management system because the control unit does not initiate the waveform capture following evaluation of data communicated from a remote monitoring device 6. Instead, the trigger signal is generated by the monitoring device 6 and communicated directly to the other monitoring devices 6 in the synchronized group over the power management communication network 48. In other words, the invention embodied in FIG. 4 and FIG. 6 retains the advantages of distributed trigger signal generation.

The invention described in FIG. 4 and FIG. 6 allows the user to choose a synchronized group of monitoring devices 6 that will share trigger signals from among any of the monitoring devices 6 connected to the power management system 40. Simultaneous waveform capture will take place among the selected group when any monitoring device 6 included in the group issues a trigger signal.

Monitoring device network addresses provide a unique system address for each monitoring device 6. The selection of synchronized group members is entered at the control unit 42. For example, a user may select a synchronized group comprised of all circuit breakers located in a specific industrial switchboard or loadcenter. Alternatively, a user may select a synchronized group among all main circuit interrupters located in the power distribution system. Or the user may select a synchronized group among all power source monitoring devices such as those that monitor generators and utility ties. A single monitoring device 6 may be included in multiple synchronized groups. Each monitoring device 6 only responds to external trigger signals issued by monitoring devices 6 that are members of a shared synchronized group and trigger signals generated internally to the monitoring device 6. Data retrieval and capture reset is performed as described for the embodiment shown in FIG. 3 and FIG. 5.

The invention is also designed for retrofitting existing power equipment for direct monitoring device 6 to monitoring device 6 high speed trigger communication and simultaneous waveform capture. For example, the monitoring device shown in FIG. 2 could be installed in place of existing electronic trip units that are not equipped with external trigger communication. Existing current sensor 98 and voltage sensor 99 inputs can continue to be used. A trigger communication network 20 can be installed to interconnect multiple monitoring devices 6 to form a synchronized group.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A circuit monitoring system, comprising:
    a plurality of monitoring devices, at least two of said monitoring devices being responsive to a trigger event for capturing at least one sample point of a current or voltage waveform, at least one of said monitoring devices being an initiating monitoring device for generating an internal trigger signal at an occurrence of said trigger event; and
    a trigger communication network interconnecting said monitoring devices, said initiating monitoring device generating an external trigger signal when said internal trigger signal is generated, said trigger communication network communicating said external trigger signal to at least one other of said monitoring devices, said at least one other of said monitoring devices being a non-initiating monitoring device.

2. The circuit monitoring system as claimed in claim 1, wherein said non-initiating device is responsive to said external trigger signal at substantially the same time as said initiating monitoring device is responsive to said internal trigger signal.

3. The circuit monitoring system as claimed in claim 2, wherein said initiating monitoring device records event timing of said trigger event.

4. The circuit monitoring system as claimed in claim 2, wherein said non-initiating device is responsive to said external trigger signal within 4 mS of the initiating monitoring device response to said internal trigger signal.

5. The circuit monitoring system as claimed in claim 1, wherein said trigger communication network is a high-speed data system.

6. The circuit monitoring system as claimed in claim 5, wherein said trigger communication network has a communication speed faster than a duration of a cycle of said current or voltage waveform.

7. The circuit monitoring system as claimed in claim 6, wherein said communication speed is about 1 mS or less.

8. The circuit monitoring system as claimed in claim 1, wherein the trigger communication network is interconnected between a trigger port located at each of said monitoring devices.

9. The circuit monitoring system as claimed in claim 8, wherein the trigger port is connected to a trigger transceiver located in said monitoring devices.

10. The circuit monitor system as claimed in claim 9, wherein said monitoring device is installed in a circuit interrupter.

11. The circuit monitoring system as claimed in claim 10, wherein said circuit interrupter is a circuit breaker.

12. The circuit monitoring system as claimed in claim 11, wherein said circuit breaker is installed in an industrial loadcenter.

13. The circuit monitoring system as claimed in claim 1, wherein said memory stores said power system waveform for a rolling period.

14. The circuit monitoring system as claimed in claim 13, wherein said power system waveform stored includes a pre-trigger and a post trigger waveform.

15. The circuit monitoring system as claimed in claim 1, wherein said monitoring devices are associated with a power management system.

16. The circuit monitoring system as claimed in claim 15, wherein said power management system retrieves said sample point from said monitoring devices.

17. The circuit monitoring system as claimed in claim 16, wherein said power management system resets said monitoring devices.

18. The circuit monitoring system as claimed in claim 17, wherein said power management system sets a trigger event threshold for said monitoring devices.

19. The circuit monitoring system as claimed in claim 18, wherein said trigger communication network is integrated with a power management communication network of said power management system.

20. The circuit monitoring system as claimed in claim 19, wherein a group of said monitoring devices are synchronized and are responsive, when user selected, to said external or internal trigger signal when issued by any member of said group of said monitoring devices that are synchronized.

21. The circuit monitoring system as claimed in claim 20, wherein said external trigger signal is communicated via said power management communication system.

22. The circuit monitoring system as claimed in claim 21, wherein said power management system communicates a time synchronization signal to said monitoring devices.

23. The circuit monitoring system as claimed in claim 2, wherein said monitoring devices include at least one electronic trip unit.

24. The circuit monitoring system as claimed in claim 2, wherein said monitoring devices include at least one relay.

25. The circuit monitoring system as claimed in claim 2, wherein said monitoring devices include at least one meter.

26. A method of synchronized power system waveform capture, comprising:

broadcasting and receiving a trigger command from a trigger transceiver, each of a plurality of monitoring devices including one said trigger transceiver;

setting at least one trigger event threshold in at least one of said monitoring devices;

communicating a trigger command via a high speed communication network to other of said monitoring devices when said trigger event threshold is reached; and storing power system waveform data in memory of each of said monitoring devices at substantially the same time in response to said trigger command.

27. The method of claim 26, further comprising synchronizing a group of monitoring devices selected by a user.

28. The method of claim 27, wherein said group of monitoring devices are selected by a user selecting at said monitoring devices.

29. The method of claim 28, wherein said group of monitoring devices is selected by a user selecting at a control unit.

30. A power management communication system with distributed trigger signal generation, comprising:

a control unit;

a power management communication network including a trigger communication network; and a plurality of monitoring devices, at least two of said monitoring devices being responsive to a trigger event for capturing at least one sample point of a current or voltage waveform, at least one of said monitoring devices being an initiating monitoring device for generating an internal trigger signal at an occurrence of said trigger event.

31. The power management communication system as claimed in claim 30, wherein said initiating monitoring device generating an external trigger signal when said internal trigger signal is generated, said trigger communication network communicating said external trigger signal to at least one other of said monitoring devices over said power management communication network, said at least one other of said monitoring devices being a non-initiating monitoring device.

32. The power management communication system as claimed in claim 31, wherein said non-initiating device is responsive to said external trigger signal at substantially the same time as said initiating monitoring device is responsive to said internal trigger signal.

* * * * *